United States Patent
Killion et al.

(10) Patent No.: US 7,003,126 B2
(45) Date of Patent: Feb. 21, 2006

(54) DYNAMIC RANGE ANALOG TO DIGITAL CONVERTER SUITABLE FOR HEARING AID APPLICATIONS

(75) Inventors: Mead C. Killion, Elk Grove Village, IL (US); Dan Mapes-Riordan, Evanston, IL (US)

(73) Assignee: Etymotic Research, Inc., Elk Grove Village, IL (US)

( * ) Notice: Subject to any disclaimer, the term of this patent is extended or adjusted under 35 U.S.C. 154(b) by 250 days.

(21) Appl. No.: 10/295,973

(22) Filed: Nov. 15, 2002

(65) Prior Publication Data

US 2003/0091207 A1    May 15, 2003

Related U.S. Application Data

(60) Provisional application No. 60/332,817, filed on Nov. 15, 2001.

(51) Int. Cl.
   *H04R 25/00*    (2006.01)
(52) U.S. Cl. ...................................... 381/312; 381/316
(58) Field of Classification Search ........ 381/312–313, 381/316–318, 320–321; 600/22, 25; 607/55–57
   See application file for complete search history.

(56) References Cited

U.S. PATENT DOCUMENTS

| | | | |
|---|---|---|---|
| 3,611,350 A | 10/1971 | Leibowitz et al. | |
| 4,622,440 A | 11/1986 | Slavin | |
| 4,633,498 A | 12/1986 | Warnke et al. | |
| 6,115,478 A | 9/2000 | Schneider | |
| 6,554,762 B1 * | 4/2003 | Leysieffer | 600/25 |
| 2002/0012438 A1 | 1/2002 | Leysieffer et al. | |

* cited by examiner

*Primary Examiner*—Suhan Ni
(74) *Attorney, Agent, or Firm*—McAndrews, Held & Malloy, Ltd

(57) ABSTRACT

An improved analog-to-digital converter device suitable for use in digital hearing aids, and methods for operating such a device are disclosed. Aspects of the present invention may provide a full 16–18 bits (96–108 dB) of dynamic range in a digital hearing aid circuit using 14-bit analog-to-digital converters typically available for hearing aid use. An embodiment of the present invention may use two analog-to-digital converters that are clocked by the same sampling trigger. One of the converters may be preceded by an amplifier having, for example, 24 dB of gain, while the other converter may be preceded by an amplifier having 0 dB of gain. The output of the first converter or the output of the second converter may be used, or a combination of the two outputs may be used to produce audio for the hearing aid user, depending upon input signal level.

6 Claims, 4 Drawing Sheets

DYNAMIC RANGE ANALOG TO DIGITAL CONVERTER SUITABLE FOR HEARING AID APPLICATIONS

RELATED APPLICATIONS

The applicants claim priority based on provisional application Ser. No. 60/332,817, "Improved Dynamic Range Analog to Digital Converter Suitable for Hearing Aid Applications", filed Nov. 15, 2001, the complete subject matter of which is incorporated herein by reference in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

The introduction of digital signal processing to hearing aids provided greater flexibility than had been previously available. In the initial excitement, many of the digital hearing aids, which often sold for $2000–$3000 each, were advertised as "CD quality." In fact, most had only a 6–7 kHz bandwidth, and instead of the 96 dB dynamic range of compact discs, they had only 80–84 dB dynamic range. The first inventor has listened to virtually all the available digital hearing aids over the years, and found that as a result of their limited dynamic range they were unsuitable for use while playing the violin, playing the piano, directing a choir, or singing in a choir. With one or more of those activities, the digital hearing aids would distort. The distortion was sometimes so bad that the hearing aids had to be removed in order to continue with the task.

Another problem with analog hearing aids has been the degraded sound quality caused by un-damped peaks. This is also common in digital hearing aids. This can be solved with "electronic damping" as described in U.S. Pat. No. 5,812,679, for example. However, in most cases, a readily accessible switched capacitor filter design suitable for that application had a relatively high noise level. In order to overcome this noise level, a switchable pre-amplifier preceding the switched capacitor filter and a switchable attenuator following the switched capacitor filter was introduced. If the gain of the preamplifier was matched to the attenuation of the attenuator, it was possible to switch the gain in and out with no audible tick or pop, provided the switched capacitor filter was replaced by a piece of wire. When the time delay of the variable capacitor filter was introduced, a click could be heard each time the gain was automatically switched in and out as the level increased or decreased. A suitable time delay was then inserted between the time the preamplifier gain was increased, for example, and the time the post-filter attenuator was switched in. By adjusting this time delay, it was possible to minimize the click. Under no circumstances that were tested, however, was the click eliminated. This result was traced to the frequency-dependent time delay of the filter. The time-delayed switching approach worked well when the time delay of the filter block was independent of frequency and the switching delay could be made closely equal to the delay through the filter.

Up until now, the four regular players in the Chicago Symphony who wear hearing aids during performances used analog "K-AMP" hearing aids as described by Killion et al in U.S. Pat. No. 4,592,087 (1986); U.S. Pat. No. 4,170,720 (1979); U.S. Pat. No. 5,131,046 (1992); and U.S. Pat. No. 5,144,675 (1992), for the reasons described above.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

An embodiment of the present invention may comprise at least one microphone, a first preamplifier operatively coupled to at least one microphone, a second preamplifier operatively coupled to the at least one microphone, an analog-to-digital converter, and a switch operatively coupled to first preamplifier, the second preamplifier and the analog-to-digital converter, such that the switch switches between an output generated by the first preamplifier and an output generated by the second preamplifier for input to the analog-to-digital converter. The first preamplifier may comprise a low-amplitude preamplifier and the second preamplifier may comprise a high-amplitude preamplifier. The first preamplifier may be selected by the switch for low level signals generated by the microphone and the second preamplifier may be selected by the switch for high level signals generated by the microphone. An embodiment according to the present invention may also include a digital signal processor that applies a first gain correction when the first preamplifier is selected, and a second gain correction when the second preamplifier is selected.

Another embodiment in accordance with the present invention may have a first analog-to-digital converter and a second analog-to-digital converter, with a single clock that provides a sampling trigger for both the first and second analog-to-digital converters. In such an embodiment, the first analog-to-digital converter may be a low-amplitude analog-to-digital converter, and the second analog-to-digital converter may be a high-amplitude analog-to-digital converter. The embodiment may also include a digital signal processor that uses a first bit string from the first analog-to-digital converter when an input is below an amplitude level, and a second bit string from the second analog-to-digital converter when the input is above an amplitude level, where the amplitude level may be a single amplitude level. In addition, the digital signal processor in an embodiment may use a first bit string from the first analog-to-digital converter when an input is below a first amplitude level, a second bit string from the second analog-to-digital converter when the input is above a second amplitude level, and a combination of the first and second bit strings when the input is between the first and second amplitude levels.

A further embodiment of the present invention may comprise a first analog-to-digital converter, a second analog-to-digital converter, and a digital signal processor that uses a first bit string from the first analog-to-digital converter when an input is below an amplitude level, and a second bit string from the second analog-to-digital converter when the input is above an amplitude level. In such an arrangement, the first analog-to-digital converter may be a low-amplitude analog-to-digital converter, and the second analog-to-digital converter may be a high-amplitude analog-to-digital converter. The amplitude level may be a single amplitude level, or the digital signal processor may use the first bit string from the first analog-to-digital converter when the input is below a first amplitude level, the second bit string from the second analog-to-digital converter when the input is above a second amplitude level, and a combination of the first and second bit strings when the input is between the first and second amplitude levels. Further, a single clock may be the sampling trigger for both the first and second analog-to-digital converters.

Another aspect of the present invention can be seen in a method of operating a digital hearing aid, the method comprising converting sound into an electrical signal, amplifying the electrical signal to generate a first amplified signal, amplifying the electrical signal to generate a second amplified signal, selecting one of the first amplified signal and the second amplified signal based on the electrical signal, and converting the selected signal to a digital value. In addition, a first gain correction may be applied when the first amplified signal is selected, and a second gain correction may be applied when the second amplified signal is selected.

An additional embodiment according to the present invention is illustrated in a method of operating a digital hearing aid, the method including generating a first digital signal using a first analog-to-digital converter, generating a second digital signal using a second analog-to-digital converter, and triggering the sample conversion of both the first analog-to-digital converter and the sample conversion of the second analog-to-digital converter from a single clock. In such an embodiment, the first analog-to-digital converter may be a low-amplitude analog-to-digital converter, and the second analog-to-digital converter may be a high-amplitude analog-to-digital converter. The embodiment may process a first bit string from the first analog-to-digital converter when an input is below an amplitude level, and process a second bit string from the second analog-to-digital converter when the input is above an amplitude level, where the amplitude level may be a single amplitude level. The present invention may also be arranged to process a first bit string from the first analog-to-digital converter when an input is below a first amplitude level, a second bit string from the second analog-to-digital converter when the input is above a second amplitude level, and a combination of the first bit string and the second bit string when the input is between the first and second amplitude levels.

Yet another embodiment according to the present invention comprises receiving a bit string from a first analog-to-digital converter, receiving a bit string from a second analog-to-digital converter, and processing the first bit string from the first analog-to-digital converter when an input is below an amplitude level, and the second bit string from the second analog-to-digital converter when the input is above an amplitude level. The first analog-to-digital converter may be a low-amplitude analog-to-digital converter, and the second analog-to-digital converter may be a high-amplitude analog-to-digital converter. In addition, the amplitude level may be a single amplitude level, or the first bit string from the first analog-to-digital converter may be processed when the input is below a first amplitude level, the second bit string from the second analog-to-digital converter may be processed when the input is above a second amplitude level, and a combination of the first and second bit strings may be processed when the input is between the first and second amplitude levels. The sample conversion of both the first analog-to-digital converter and the second analog-to-digital converters may be triggered from a single clock.

These and other advantages, aspects, and novel features of the present invention, as well as details of illustrated embodiments, thereof, will be more fully understood from the following description and drawings.

DETAILED DESCRIPTION OF THE INVENTION

Figure 1:
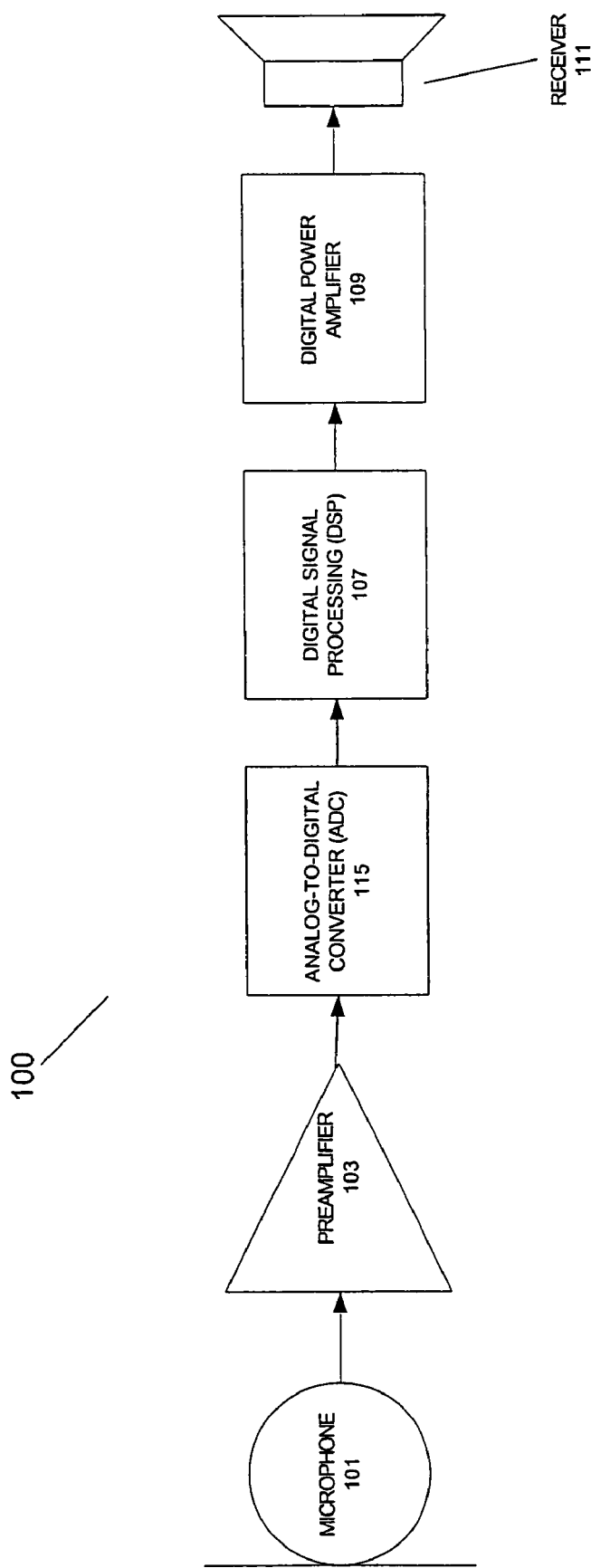
FIG. 1 shows a functional block diagram of a generic digital hearing aid system.

Addressing the problems of the prior art, aspects of the present invention provide a full 16–18 bit (96–108 dB) dynamic range in a digital hearing aid circuit. In one approach, a relatively small and relatively frequency-independent time delay in the A/D operation may be arranged, in which case a delayed switch activation is used to minimize the tick. An all-digital approach, however, is sometimes limited in its tick-free operation by the quantization of the sampling operation. In particular, with a 32 kHz effective sampling frequency, the smallest change is 31.25 $\mu$sec. In listening tests, a delay error as small as 3.2 $\mu$s can be detected as a small click with some program materials. In carefully contrived listening tests, some listeners can detect errors as small as 1.4 $\mu$sec.

In another approach, an even better performance is obtained with the use of two identical analog-to-digital converters (ADCs) operating from a single clock. One of the two ADC inputs may be preceded by an amplifier having, e.g., 24 dB gain, forming a low-amplitude ADC, while the other may be preceded by an amplifier having, e.g., 0 dB gain, forming a high-amplitude ADC. In this example, the two binary strings that result from the two ADCs differ, in general, by 4 bits, provided that both ADCs are operating linearly. Shifting the binary string from the high-amplitude ADC left by four bits adds four zeros to the least-significant end of the string, producing a new string with four trailing zeros. To a first approximation, the center 10 bits of the modified high-amplitude string now equals the highest (most significant) 10 bits in the low-amplitude ADC string. For signals falling in that center 10 bit range, therefore, switching between the two strings (high-amplitude modified and low-amplitude unmodified) produces little audible effect. Exceptions occur when the input level exceeds the upper limit of the low-amplitude ADC, or the input level falls below the lower limit of the high-amplitude ADC. In either of the latter two cases, one or the other of the ADCs contains information that is lacking in the other.

The additional information may be exploited to produce a more satisfactory hearing aid whose improved dynamic range makes it suitable for critical users such as violinists, pianists, choir directors, singers, etc.

Readily available analog-to-digital converters operating from the same clock can have close enough amplitude and time matching such that switching occurs between a low-amplitude ADC and a high-amplitude ADC, as described above, without audible glitches or other artifacts provided the preamplifier gains are accurate. By use of a 24 dB preamplifier in the low-amplitude ADC, essentially flawless 17 to 18 bit equivalent operation is obtained from two converters whose effective dynamic range was equivalent to only 14 bits, typical of present-day digital hearing aid circuits, and thus readily available.

In one embodiment, the system of the present invention is also relatively immune to small inaccuracies in preamplifier gain, allowing inexpensive preamplifiers suitable for hearing aids to be used. In particular, up to 0.5 dB error in gain may be tolerated if, rather than simply switching from one binary string to the other as the amplitude increases or decreases, a sliding proportion of the two binary strings is used. For example, 100% of the low-amplitude ADC string may be used up until a certain level, above which an increasing proportion of the high-amplitude string may be used. Above a second level, 100% of the high-amplitude string may be used. In this manner, noise is minimized at low levels while overload is avoided at high levels.

A simple formula may be used to choose which of the strings to use. If we let L denote the level of the input, A denote the fractional distance between a low level, L1, and a high level, L2, P denote the modified high-amplitude string, Q denote the original low-amplitude string, and R denote the resulting 18 bit (in this example) string, then:

R=Q for signals below a lower level L1
R=P for signals above a high level L2, and $$A=(L-L1)/(L2-L1)$$

$$R=A*P+(1-A)*Q \text{ for signals levels between } L1 \text{ and } L2.$$ (Formula 1)

Thus for low-level sounds, the bit string from the 24 dB preamplifier block would be given 100% weight. At high levels, the bit string from the un-amplified block would be given 100% weight. In between, a sliding proportion is used.

With the above method, a 0.5 dB error in the gains and attenuator combination is entirely inaudible as judged by extensive user listening to singing, piano and orchestral music. No audible overload is apparent to a user while the user plays the violin, piano, or singing, each of which can produce 105 to 110 dB at the ear as read on a sound level meter, corresponding to 115 dB SPL instantaneous peaks.

FIG. 1 shows a functional block diagram of a generic digital hearing aid system 100. A microphone 101 senses sound waves converting them into electrical signals. These signals are amplified in preamplifier 103 and then converted into a digital signal by the analog-to-digital converter (ADC) 115. The digital signal processor (DSP) 107 of the hearing aid operates on the digital signal using a programmable algorithm suitable for a hearing aid. The processed signal is typically sent to a digital power amplifier 109 and then to receiver 111, where it is transduced into sound for transmission to the ear canal of a user.

Figure 2:
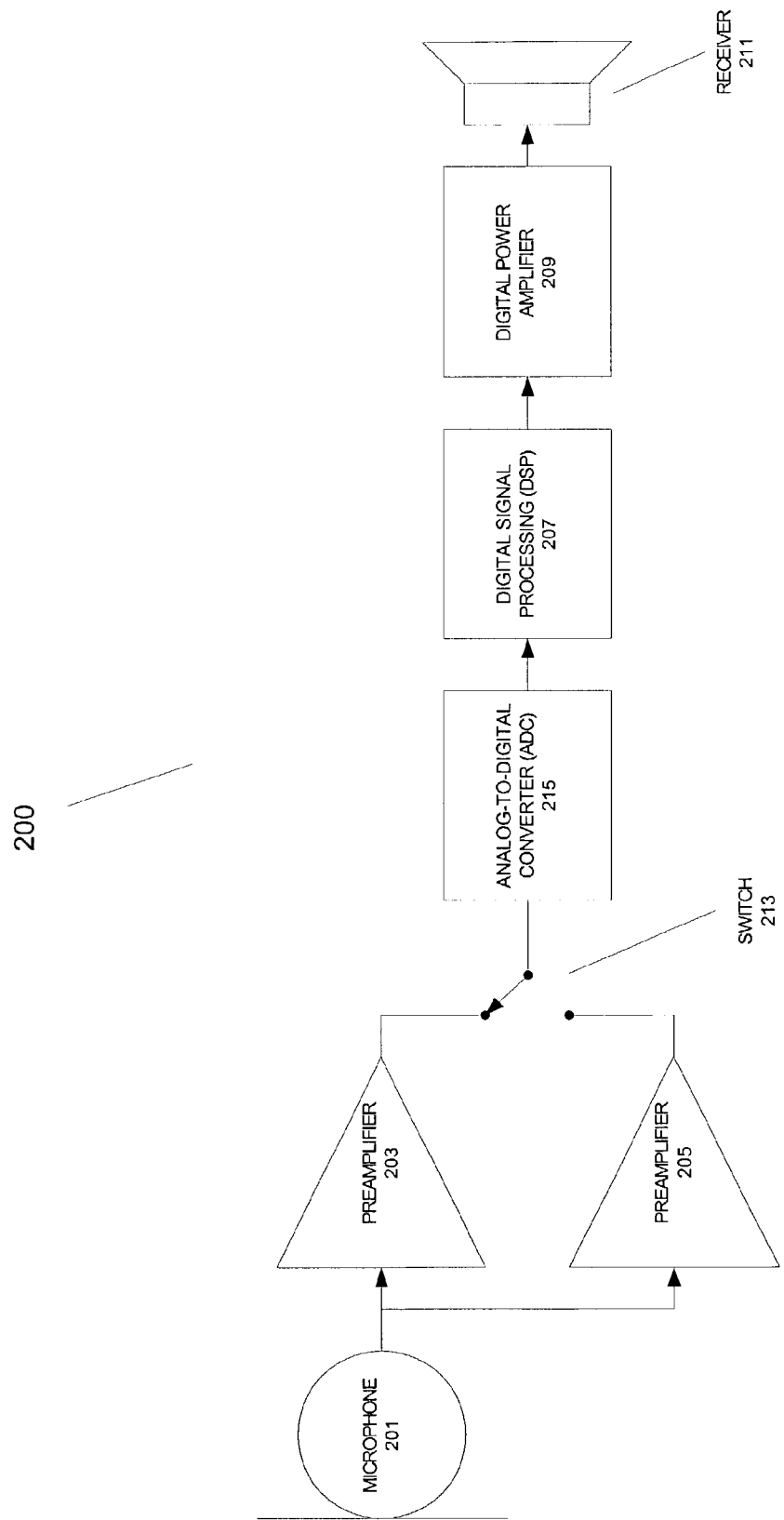
FIG. 2 shows a block diagram of one method of increasing the dynamic range of the analog-to-digital conversion of the hearing aid.

FIG. 2 shows a block diagram 200 of one method of increasing the dynamic range of the analog-to-digital conversion of the hearing aid. In FIG. 1, the signal from microphone 101 is fed to two preamplifiers, low-amplitude preamplifier 203 and high-amplitude preamplifier 205. The output of each preamplifier is selectively connected through switch 213 to ADC circuit 215 so that preamplifier 203 is connected for low-level signals and preamplifier 205 is connected for high-level signals. The output of ADC 215 is fed to the digital signal processor 207 and hence to digital power amplifier 209 and receiver 211 (as above). The DSP 207 applies the proper gain correction corresponding to the switch position in use. As noted above, any delay in the analog-to-digital converter or associated circuitry tends to produce an audible click in the output.

Figure 3:
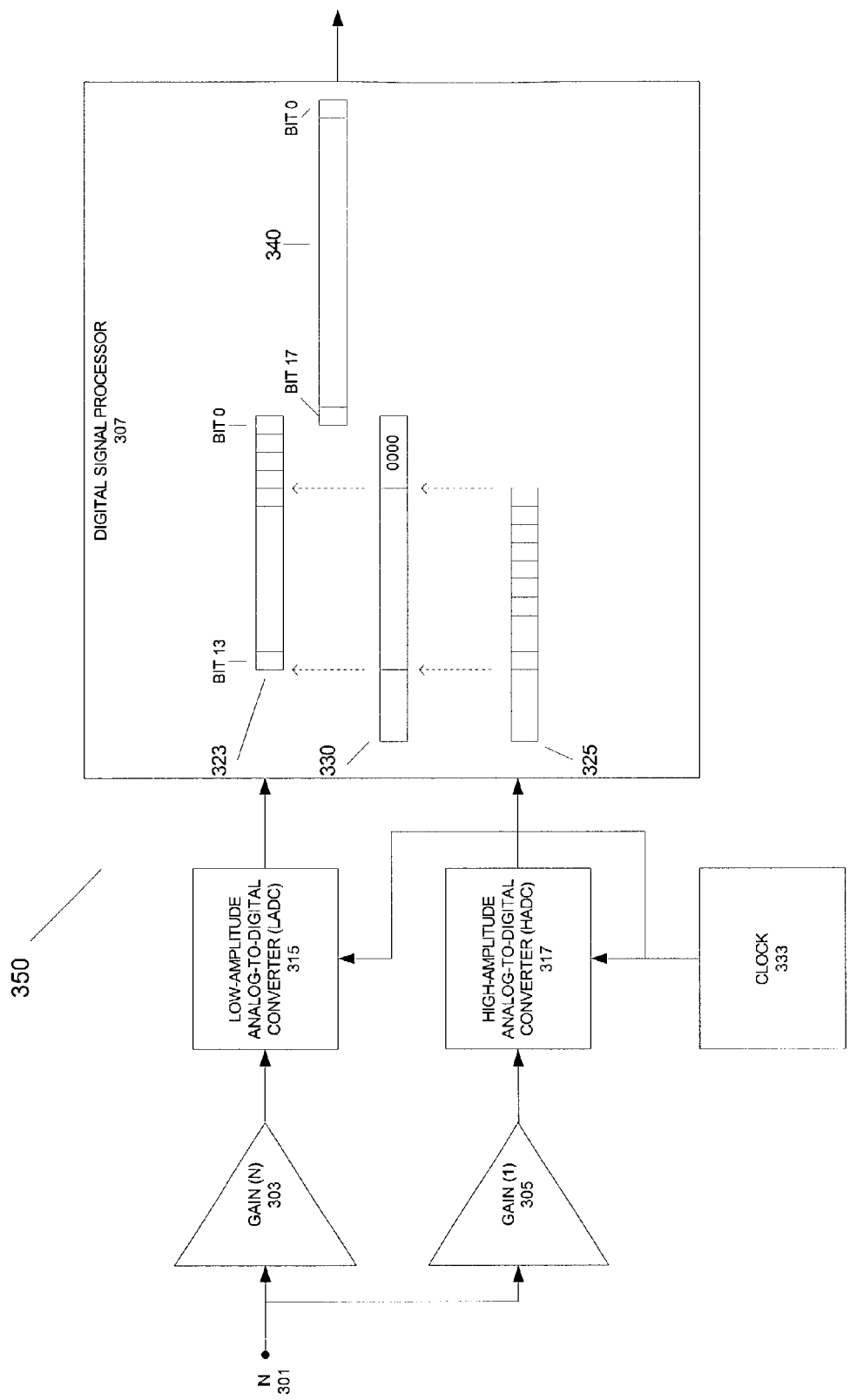
FIG. 3 shows a block diagram of an alternate method of increasing the dynamic range of the analog-to-digital conversion of a hearing aid.

FIG. 3 shows a block diagram 350 of an alternate method of increasing the dynamic range of the analog-to-digital conversion of a hearing aid. The analog input signal at input 301 is passed to two preamplifiers 303 and 305 connected respectively to two ADCs 315 and 317. ADC 315 is a low-amplitude converter and ADC 317 is a high-amplitude converter. A single clock 333 provides the identical sampling trigger to both converters. Preamplifier 303 may have, for example, 24 dB of gain and preamplifier 305 may have, for example, 0 dB of gain. The outputs of ADCs 315 and 317 are fed to DSP 307 and then to a digital power amplifier (not shown) and receiver (not shown) similar to those shown in FIG. 2.

If the gain of preamplifier 303 is made 24 dB or 16 times, and the gain of preamplifier 305 in FIG. 3 is made 0 dB or 1 times, for example, then the least significant bit in the output of ADC 317 corresponds to an input signal 16 times greater than that of the least significant bit of ADC 315. To explain, an input signal of 0.2 $\mu$V at input 301, for example, is amplified to 3.2 $\mu$V at the output of preamplifier 303, while the same signal appears as 0.2 $\mu$V at the output of preamplifier 305. At the digitized output of ADC 315, therefore, the minimum step size or resolution or least significant bit will correspond to 0.2 $\mu$V referred to the input 301, while that of ADC 317 will correspond to 3.2 $\mu$V.

The bit string from high-amplitude ADC 317 may be bit shifted by adding four zeros to the least-significant end of the bit string 325, which is numerically equivalent to multiplying by 16 times, forming bit string 330 whose central ten bits is generally identical or nearly identical to those in bit string 323.

DSP 307 contains an algorithm whereby bit string 323 from low-amplitude ADC 315 or bit string 330 obtained as described above from high-amplitude ADC 317 are combined to form, for example, a single 18-bit string 340. The output of bit string 340 is audibly indistinguishable from a single 18-bit analog-to-digital converter. The result is an ADC 350 with improved dynamic range over that possible with either converter operating alone.

If bit string 323 and 330 are combined in accordance with Formula 1 above, for example, then at high levels only bits from bit string 330 are used and at low levels only bits from bit string 323 are used. In operation, two input levels, L1 and L2, are programmed into DSP 307. Below signal level L1, 100% of bit string 323 is used and 0% of bit string 330 is used, to form the resulting output bit string 340. Above signal level L2, the opposite occurs, so that 0% of bit string 323 is used and 100% of bit string 330 is used. Between signal levels L1 and L2, the proportion of each that is used is determined by a formula such as Formula 1. If Formula 1 is used, for example, for input levels halfway between levels L1 and L2 the proportion is 50—50. It should be understood that other switching functions are possible, such as a logarithmic function between L1 and L2. In some cases such a function may maximize the signal-to-quantization-noise ratio between L1 and L 2.

Figure 4:
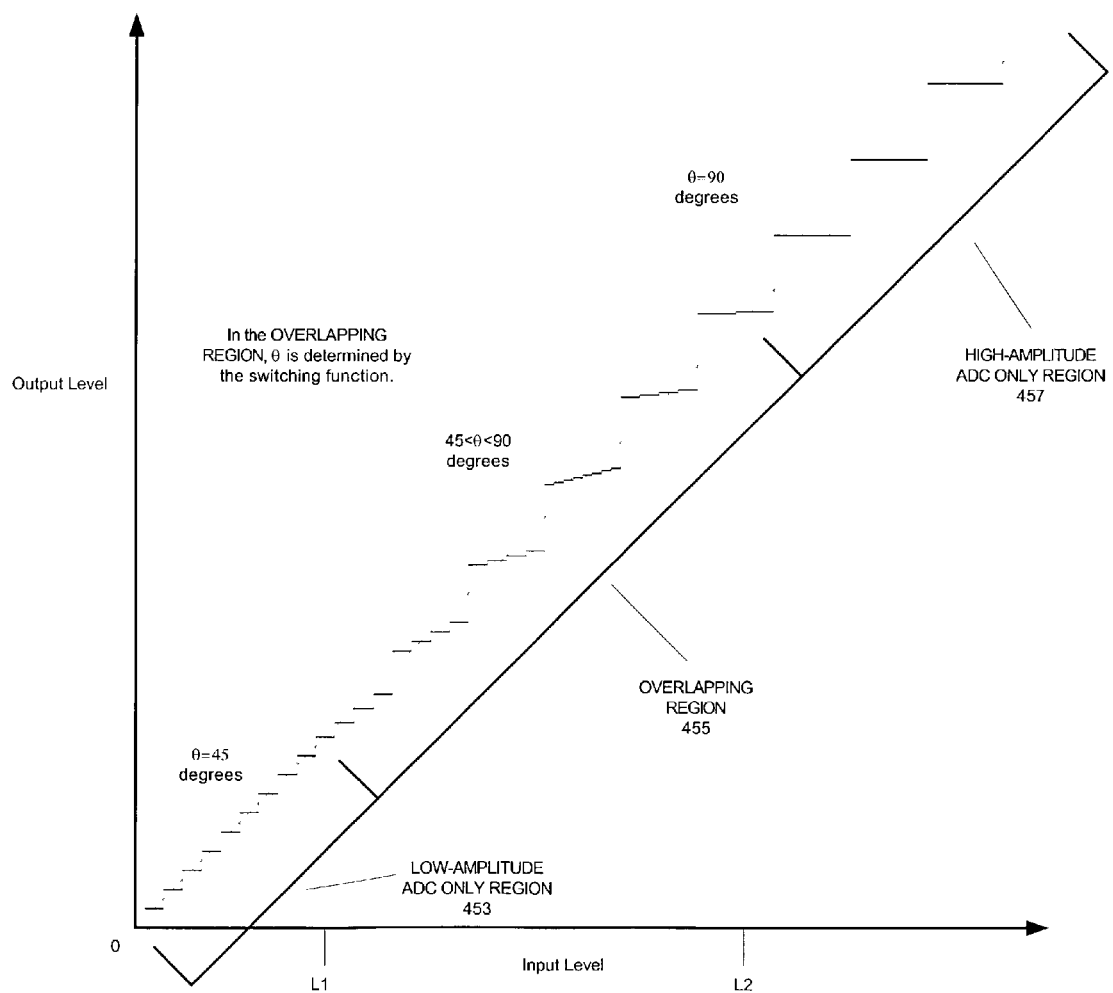
FIG. 4 illustrates the operation of a preferred form of the present invention.

FIG. 4 graphically illustrates the operation of the preferred form of the present invention. At high input levels above level L2 shown in the portion of the graph 457, the step sizes are larger than the step sizes at low input levels below L1 shown in the portion 453 of the graph in FIG. 4.

This large step size in region 457 does not introduce audible graininess because the signal levels required for operation in region 457 are very large compared to the step size in that region. In particular, it has been found that if the instantaneous level of speech or music is adjusted to just below clipping in an analog-to-digital converter, then only 8 or 10 bits are required for accurate reproduction. The dynamic range of speech spoken with constant effort, for example, is only about 30 dB. Thus even an 8-bit converter with 48 dB dynamic range is often adequate for audibly perfect reproduction. The "Project Phoenix" digital hearing aid introduced by Nicolet in the 1980's, for example had only an 8-bit analog-to-digital converter, but was a commercial failure. Part of the reason the Project Phoenix hearing aid was a failure in the marketplace may have been that no distinction was made between the 8 to 10 bits dynamic range needed on an instantaneous basis and the 16 to 18 bits of dynamic range needed to encompass very quiet to very loud speech and music.

At low levels, the signal is small and the smaller step size shown in FIG. 4 for region 453 is used for transparent sound.

For inputs between reference level L1 and an upper reference level L2 as shown in FIG. 4, the operation of Formula 1 or its substitute acts to produce the best possible composite step size, as illustrated by the portion of the curve marked 455 in FIG. 4.

By means of the operation described here, a high-performance high-resolution converter may be formed from two synchronous, lower-resolution converters.

The graph in FIG. 4 illustrates the quantization characteristics of the present analog-to-digital converter with emphasis on the overlapping region. An ideal I/O function is a straight line on a 45-degree angle starting from the origin. Digitization of the analog signal entails quantizing the signal amplitude into discrete steps such that the ADC I/O curve is a staircase function along the ideal 45-degree line. The quantization steps of the low-amplitude ADC are relatively small. The quantization steps are largest for the high-amplitude ADC. It can be argued that such large quantization steps are not detrimental to overall system performance since they are present only when signal amplitude is also large such that the overall signal-to-quantization noise ratio is favorable. In the overlapping region where both ADCs are active, the quantization step is a combination of small, low-amplitude ADC quantization steps and the relatively large, high-amplitude ADC quantization steps. One way of thinking of these composite quantization steps in the overlapping region is as the small quantization steps "riding on top of" the large quantization steps with the angle of the large quantization steps determined by the gain value (A). When gain (A) is near one, the system output is largely determined by the low-amplitude ADC and the angle of the large quantization step is near 45-degrees. When the gain (A) is near zero, the system output is largely determined by the high-amplitude ADC and the angle of the large quantization step is near 90 degrees. The switching function determines how this angle changes with signal level. FIG. 4 illustrates a linear switch function, and the resulting angle gradually changes from 45 to 90 degrees. If the switching function is a constant, the large quantization step angle would be a fixed 67.5-degrees in the overlapping region.

Accordingly, the present invention may be realized in hardware, software, or a combination of hardware and software. The present invention may be realized in a centralized fashion in one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention also may be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

Notwithstanding, the invention and its inventive arrangements disclosed herein may be embodied in other forms without departing from the spirit or essential attributes thereof. Accordingly, reference should be made to the following claims, rather than to the foregoing specification, as indicating the scope of the invention. In this regard, the description above is intended by way of example only and is not intended to limit the present invention in any way, except as set forth in the following claims.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A digital hearing aid comprising:
   a first and second analog-to-digital converter, wherein the first analog-to-digital converter is a low-amplitude analog-to-digital converter, and the second analog-to-digital converter is a high-amplitude analog-to-digital convert; and
   a digital signal processor that uses a first bit string from the first analog-to-digital converter when an input is below an amplitude level, and a second bit string from the second analog-to-digital converter when the input is above an amplitude level.

2. The digital hearing aid of claim 1 comprising a single amplitude level.

3. A digital hearing aid comprising:
   a first analog-to-digital converter;
   a second analog-to-digital converter; and
   a digital signal processor that uses a first bit string from the first analog-to-digital converter when an input is below an amplitude level, and a second bit string from the second analog-to-digital converter when the input is above an amplitude level, wherein the digital signal processor uses the first bit string from the first analog-to-digital converter where the input is below a first amplitude level, the second bit string from the second analog-to-digital converter when the input is above a second amplitude level, and a combination of the first and second bit strings when the input is between the first and second amplitude levels.

4. A method of operating a digital hearing aid, the method comprising:
   receiving a bit string from a first analog-to-digital converter, said first analog-to-digital converter being a low-amplitude analog-to-digital converter;
   receiving a bit string from a second analog-to-digital converter, said second analog-to-digital converter being a high-amplitude analog-to-digital converter; and processing the bit string from the first analog-to-digital converter when an input is below an amplitude level, and the second bit string from the second analog-to-digital converter when the input is above an amplitude level.

5. The method of claim 4 wherein the amplitude level is a single amplitude level.

6. A method of operating a digital hearing aid, the method comprising:

receiving a bit string from a first analog-to-digital converter;

receiving a bit string from a second analog-to-digital converter; and processing the first bit string from the first analog-to-digital converter when the input is below a first amplitude level, processing the second bit string from the second analog-to-digital converter when the input is above a second amplitude level, and processing a combination of the first and second bit strings when the input is between the first and second amplitude levels.

* * * * *